(12) United States Patent
Lee

(10) Patent No.: US 7,935,949 B2
(45) Date of Patent: May 3, 2011

(54) SWITCHING DEVICE WITH SOLID ELECTROLYTE LAYER

(75) Inventor: Yu-Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 45 days.

(21) Appl. No.: 12/476,330

(22) Filed: Jun. 2, 2009

(65) Prior Publication Data
US 2010/0165543 A1    Jul. 1, 2010

(30) Foreign Application Priority Data
Dec. 29, 2008    (KR) .................... 10-2008-0135526

(51) Int. Cl.
*H01L 29/02* (2006.01)

(52) U.S. Cl. .. 257/2; 257/3; 257/4; 257/5; 257/E29.003; 438/102; 438/103; 365/163; 361/435

(58) Field of Classification Search .................. 257/1–5, 257/E29.002; 438/102–103; 365/163; 361/435
See application file for complete search history.

(56) References Cited

U.S. PATENT DOCUMENTS
6,294,111 B1 *  9/2001  Shacklett et al. .......... 252/518.1
6,301,039 B1 * 10/2001  Tench .......................... 359/267

FOREIGN PATENT DOCUMENTS
KR    1020070075812    7/2007
KR    1020100004363    1/2010

OTHER PUBLICATIONS

Notice of Preliminary Rejection issued from Korean Intellectual Property Office on Oct. 26, 2010.

* cited by examiner

*Primary Examiner* — Bradley K Smith
*Assistant Examiner* — Jami M Valentine
(74) *Attorney, Agent, or Firm* — IP & T Group LLP

(57) ABSTRACT

A switching device with a solid electrolyte layer includes: a substrate; a lower electrode formed over the substrate; a solid electrolyte layer disposed over the lower electrode; and an upper electrode formed over the solid electrolyte layer.

16 Claims, 1 Drawing Sheet

SWITCHING DEVICE WITH SOLID ELECTROLYTE LAYER

CROSS-REFERENCE TO RELATED APPLICATIONS

The present invention claims priority of Korean patent application number 10-2008-0135526, filed on Dec. 29, 2008, the disclosure of which is incorporated by reference herein in its entirety.

BACKGROUND OF THE INVENTION

The present invention relates to a switching device and an operation method thereof, and more particularly, to a switching device including a solid electrolyte layer, and an operation method thereof.

Recently, researchers are studying to develop next-generation memory devices that can replace Dynamic Random Access Memory (DRAM) and flash memory.

Among such next-generation memory devices is a resistive memory device using a variable resistive material. The resistive memory device is capable of switching between at least two different resistive states as resistance varies drastically according to an applied voltage. The resistive memory device stores different data, which is bit data '0' or '1,' based on a resistance change of the variable resistive material. As for the resistive material having such characteristic, a transition metal oxide is generally used.

When a solid electrolyte material is interposed instead of a transition metal oxide in the same device as a resistive memory device, the switching mechanism may be different from that of the memory device using a transition metal oxide. Regardless, since the device using a solid electrolyte material also has a characteristic of switching between different resistance states according to an applied voltage, different data may be stored based on the switching characteristic. In this aspect, the device using a solid electrolyte material may be regarded as a resistive memory device in a broad sense. Hereafter, the device using a solid electrolyte material will be described in detail.

FIG. 1 is a cross-sectional view showing a conventional switching device including a solid electrolyte layer. Referring to FIG. 1, the conventional switching device includes a lower electrode 11, an upper electrode 13, and a solid electrolyte layer 12. When a negative voltage is applied to the lower electrode 11 and a positive voltage is applied to the upper electrode 13, metal ions are reduced in being transferred from the upper electrode 13 to the lower electrode 11 through the solid electrolyte layer 12 to thereby form a metal filament, which is a conductive path, in the solid electrolyte layer 12. Accordingly, the switching device turns into an on state, which is a state that the solid electrolyte layer 12 has a low resistance.

When a positive voltage is applied to the lower electrode 11 and a negative voltage is applied to the upper electrode 13, the metal filament of the solid electrolyte layer 12 is oxidized and metal ions are transferred to the upper electrode 13 to thereby remove the conductive path. Accordingly, the switching device turns into an off state, which is a state that the solid electrolyte layer 12 has a high resistance.

Two-state data may be stored in the solid electrolyte layer 12 by defining the state that the solid electrolyte layer 12 has a low resistance and the state that the solid electrolyte layer 12 has a high resistance as bit data '1' and '0,' respectively. In short, the switching device may be used as a memory device.

However, the switching device including the solid electrolyte layer 12 has the following drawbacks.

First, widely known and used solid electrolyte materials are $Ge_xSe_y$, where Ge denotes germanium; Se denotes selenide; and x and y denote positive numbers, and $Ge_xS_y$, where S denotes sulfide; and x and y denote positive numbers. Since the solid electrolyte materials like $Ge_xSe_y$ and $Ge_xS_y$ have high solubility, a switching device using such solid electrolyte material becomes sensitive to temperature and has low operation voltage. When the switching device is sensitive to temperature, transfer of ions becomes faster as temperature goes up. This may lead to an instable on/off state. On the other hand, when the operation voltage of the switching device is too low, it is hard to control the on/off state of the switching device.

In addition, since the switching operation is performed based on oxidation and reduction of metal ions, the switching speed is relatively slow.

SUMMARY OF THE INVENTION

Exemplary embodiments of the present invention are directed to providing a switching device including a solid electrolyte layer that can provide a stable on/off state, easily control on/off switching, and have an increased switching speed by raising an operation voltage of the switching device.

In accordance with an aspect of the present invention, there is provided a switching device with a solid electrolyte layer, including: a substrate; a lower electrode formed over the substrate; a solid electrolyte layer disposed over the lower electrode; and an upper electrode formed over the solid electrolyte layer.

In accordance with another aspect of the present invention, there is provided a switching device, including: a substrate; a lower electrode formed over the substrate; a first solid electrolyte layer disposed over the lower electrode; a second solid electrolyte layer disposed over the first solid electrolyte layer; and an upper electrode formed over the second solid electrolyte layer.

DESCRIPTION OF SPECIFIC EMBODIMENTS

Figure 1:
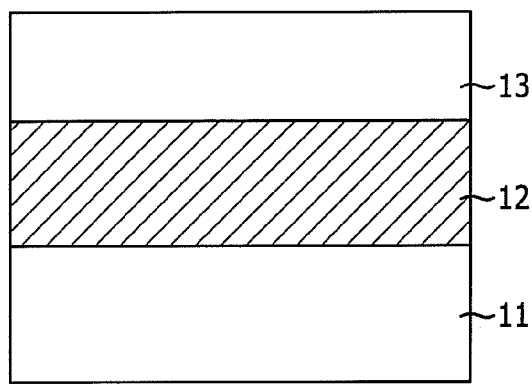
FIG. 1 is a cross-sectional view showing a conventional switching device including a solid electrolyte layer.

Other objects and advantages of the present invention can be understood by the following description, and become apparent with reference to the embodiments of the present invention.

In the drawings, the illustrated thickness of layers and regions may not be proportional to the actual sizes for illustration purposes. When a first layer is referred to as being "on" a second layer or "on" a substrate, it includes a meaning that the first layer is formed directly on the second layer or the substrate, or that a third layer may exist between the first layer and the substrate. Furthermore, the same or like reference numerals represent the same or like constituent elements, although they appear in different embodiments or drawings of the present invention.

Figure 2:
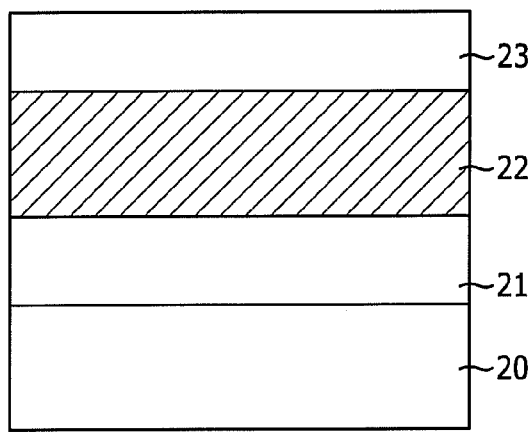
FIG. 2 is a cross-sectional view illustrating a switching device including a solid electrolyte layer in accordance with an embodiment of the present invention.

FIG. 2 is a cross-sectional view illustrating a switching device including a solid electrolyte layer in accordance with an embodiment of the present invention. Referring to FIG. 2, the switching device includes a substrate 20 with a predetermined lower structure formed therein, a lower electrode 21 formed over the substrate 20, a solid electrolyte layer 22 formed over the lower electrode 21, and an upper electrode 23 formed over the solid electrolyte layer 22. The solid electrolyte layer 22 is $Gd_xS_y$, where Gd denotes gadolinium; S denotes sulfide; and x and y denote positive numbers. Using $Gd_xS_y$ as the solid electrolyte layer 22 can reduce the transfer speed of metal ions because $Gd_xS_y$ has lower diffusion coefficient than $Ge_xSe_y$ or $Ge_xS_y$, which is used conventionally. This will be described in detail while describing corresponding section.

The lower electrode 21 may be formed of a metal material selected from the group consisting of platinum (Pt), gold (Au), aluminum (Al), silver (Ag), and tungsten (W), that are generally used as electrode materials.

The upper electrode 23 may be formed of any one material selected from the group consisting of copper (Cu), silver (Ag), and zinc (Zn), which are diffusive materials capable of diffusing metal ions to the solid electrolyte layer 22.

The solid electrolyte layer 22 formed of $Gd_xS_y$ may be doped with metal, particularly, with the same metal, e.g., Cu, as the diffusive metal forming the upper electrode 23.

Hereafter, an operation of the switching device will be described in accordance with the embodiment of the present invention.

First, a negative voltage is applied to the lower electrode 21 while a positive voltage is applied to the upper electrode 23. Then, predetermined metal ions, e.g., $Cu^+$ ions, are reduced by being transferred from the upper electrode 23 to the lower electrode 21 through the solid electrolyte layer 22. While the metal ions are being reduced, a metal filament, e.g., Cu, is formed in the solid electrolyte layer 22 and it serves as a conductive path. Accordingly, the switching device takes on a state where the solid electrolyte layer 22 has low resistance, which is an on state.

When a positive voltage is applied to the lower electrode 21 and negative voltage is applied to the upper electrode 23, the metal filament of the solid electrolyte layer 22 is oxidized and the metal ions is transferred to the upper electrode 23 to thereby remove the conductive path. Accordingly, the switching device takes on a state where the solid electrolyte layer 22 has high resistance, which is an off state.

As described above, since $Gd_xS_y$ having a small diffusion coefficient is used as the solid electrolyte layer 22, the transfer speed of the metal ions decreases. Therefore, the operation voltage of the switching device of the present embodiment increases compared to that of a conventional switching device, the switching device of the present embodiment has a stable on/off state and it is easy to control the on/off switching.

Figure 3:
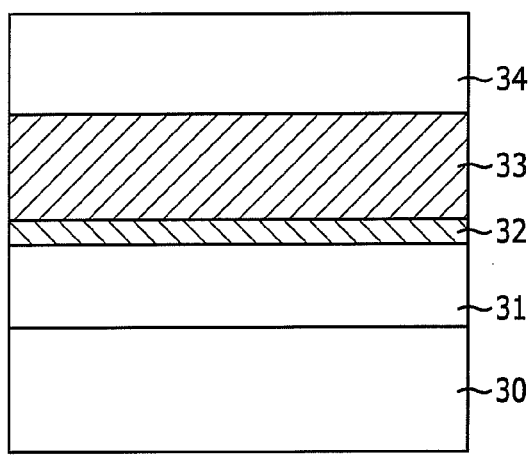
FIG. 3 is a cross-sectional view illustrating a switching device including a solid electrolyte layer in accordance with another embodiment of the present invention.

FIG. 3 is a cross-sectional view illustrating a switching device including a solid electrolyte layer in accordance with another embodiment of the present invention. Referring to FIG. 3, the switching device of this embodiment includes a substrate 30 with a predetermined lower structure, a lower electrode 31 formed over the substrate 30, a first solid electrolyte layer 32 formed over the lower electrode 31, and a second solid electrolyte layer 33 formed over the solid electrolyte layer 32, and an upper electrode 34 formed over the second solid electrolyte layer 33. The first solid electrolyte layer 32 may be formed as a thin layer with a thickness equal to or smaller than approximately 10 nm, or formed of $Gd_xO_y$, where Gd denotes gadolinium; O denotes oxygen; and x and y denote positive numbers. Forming the first solid electrolyte layer 32 as a thin layer or forming it of $Gd_xO_y$ is to define a position where a conductive path is to be formed and facilitate removal of the conductive path to thereby increase the switching speed of the switching device. This will be described in detail while describing a corresponding section.

Herein, the lower electrode 31 may be formed of any one metal material selected from the group consisting of platinum (Pt), gold (Au), aluminum (Al), silver (Ag), and tungsten (W), which are general electrode materials.

The upper electrode 34 may be formed of any one material selected from the group consisting of copper (Cu), silver (Ag), and zinc (Zn), which are diffusive materials capable of diffusing metal ions to the first and second solid electrolyte layers 32 and 33.

The second solid electrolyte layer 33 may be formed of $Ge_aSe_b$ or $Ge_aS_b$, where Ge denotes germanium; Se denotes selenide; S denotes sulfide; and a and b denote positive numbers. However, it may also be formed of $Gd_aS_b$ to decrease the transfer speed of metal ions, Gd denotes gadolinium; S denotes sulfide; and a and b denote positive numbers. The second solid electrolyte layer 33 may be doped with the same metal, e.g., Cu, as the diffusive metal forming the upper electrode 34.

Hereafter, an operation of the switching device suggested in this embodiment will be described in detail.

First, a negative voltage is applied to the lower electrode 31 while a positive voltage is applied to the upper electrode 34. Then, predetermined metal ions, e.g., $Cu^+$ ions, are reduced while being transferred from the upper electrode 34 to the lower electrode 31 through the second solid electrolyte layer 33 and the first solid electrolyte layer 32. While the metal ions are reduced, a metal filament, e.g., Cu, is formed in the second solid electrolyte layer 33 and the first solid electrolyte layer 32 and it serves as a conductive path. Accordingly, the switching device takes on a state where the first solid electrolyte layer 32 and the second solid electrolyte layer 33 have low resistance, which is an on state.

When a positive voltage is applied to the lower electrode 31 and a negative voltage is applied to the upper electrode 34, the metal filament of the first and second solid electrolyte layers 32 and 33 is oxidized and the metal ions transfer to the upper electrode 34 to thereby remove the conductive path. Accordingly, the switching device takes on a state where the first and second solid electrolyte layers 32 and 33 have high resistance, which is an off state.

Herein, when the first solid electrolyte layer 32 is formed as a thin layer having a thickness equal to or less than approximately 10 nm, or it is formed of $Gd_xO_y$, the first solid electrolyte layer 32 of the penetration section may be likely to be damaged while the metal ions go through the first solid electrolyte layer 32. Once a part of the first solid electrolyte layer 32 is damaged, the creation or removal of a conductive path occurs rapidly in the damaged part of the first solid electrolyte layer 32 while the switching device switches between on state and an off state.

Since the conductive path is removed even by a cut-off of the metal filament, switching speed can be improved.

Consequently, the switching speed of the switching device of the present embodiment increases, compared to a conventional switching device. Furthermore, when $Gd_aS_b$ having a small diffusion coefficient is used as the second solid electrolyte layer 33, the switching speed increases. In addition, the increase in the operation voltage leads to stable on/off state of the switching device and easy control of the on/off switching.

As described above, the switching device of the present invention can provide stable on/off state, easily control on/off switching, and have an increased switching speed by raising an operation voltage of the switching device.

While the present invention has been described with respect to the specific embodiments, it will be apparent to those skilled in the art that various changes and modifications may be made without departing from the spirit and scope of the invention as defined in the following claims.

Although not illustrated in the drawings, the lower electrode and the upper electrode may be modified. Also, any one between the lower electrode and the upper electrode may be of a plug type, and at least any one between lower electrode and the upper electrode may be nanowire or nanotube.

What is claimed is:

1. A switching device with a solid electrolyte layer, comprising:
   a substrate;
   a lower electrode formed over the substrate;
   a solid electrolyte layer disposed over the lower electrode; and
   an upper electrode formed over the solid electrolyte layer,
   wherein the solid electrolyte layer is formed of $Gd_xS_y$, where Gd denotes gadolinium, S denotes sulfide, and x and y denote positive numbers.

2. The switching device of claim 1, wherein the upper electrode includes diffusive metal.

3. The switching device of claim 2, wherein the diffusive metal is any one selected from the group consisting of copper (Cu), silver (Ag), and zinc (Zn).

4. The switching device of claim 2, wherein the solid electrolyte layer is doped with a metal which is the same as the diffusive metal.

5. The switching device of claim 1, wherein the switching device is switched between an on state and an off state, as a conductive path is created in or removed from the solid electrolyte layer according to voltages applied to the lower electrode and the upper electrode.

6. The switching device of claim 1, wherein the switching device forms a memory cell.

7. A switching device, comprising:
   a substrate;
   a lower electrode formed over the substrate;
   a first solid electrolyte layer disposed over the lower electrode;
   a second solid electrolyte layer disposed over the first solid electrolyte layer; and
   an upper electrode formed over the second solid electrolyte layer.

8. The switching device of claim 7, wherein the second solid electrolyte layer is formed thicker than the first solid electrolyte layer.

9. The switching device of claim 7, wherein the first solid electrolyte layer has a thickness equal to or less than approximately 10 nm.

10. The switching device of claim 7, wherein the first solid electrolyte layer is formed of $Gd_xO_y$, where Gd denotes gadolinium, O denotes oxygen; and x and y denote positive numbers.

11. The switching device of claim 7, wherein the second solid electrolyte layer is formed of $Gd_aS_b$, where Gd denotes gadolinium, S denotes sulfide, and a and b denote positive numbers.

12. The switching device of claim 7, wherein the upper electrode includes diffusive metal.

13. The switching device of claim 12, wherein the diffusive metal is any one selected from the group consisting of copper (Cu), silver (Ag), and zinc (Zn).

14. The switching device of claim 12, wherein the second solid electrolyte layer is doped with a metal that is the same as the diffusive metal.

15. The switching device of claim 7, wherein the switching device is switched between an on state and an off state, as a conductive path is created in or removed from the first solid electrolyte layer and the second solid electrolyte layer according to voltages applied to the lower electrode and the upper electrode.

16. The switching device of claim 7, wherein the switching device forms a memory cell.

* * * * *